(12) United States Patent
Nagata

(10) Patent No.: US 6,741,193 B2
(45) Date of Patent: May 25, 2004

(54) PARALLEL IN SERIAL OUT CIRCUIT HAVING FLIP-FLOP LATCHING AT MULTIPLE CLOCK RATES

(75) Inventor: Yoshihito Nagata, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/010,073

(22) Filed: Nov. 8, 2001

(65) Prior Publication Data
US 2002/0075173 A1 Jun. 20, 2002

(30) Foreign Application Priority Data
Nov. 8, 2000 (JP) ......................................... 2000-340743

(51) Int. Cl.[7] .............................. H03M 9/00; G06F 1/04; H03K 3/00
(52) U.S. Cl. ........................................ 341/101; 327/293
(58) Field of Search ................................. 327/293, 407, 327/291, 292, 294; 341/101, 100, 95

(56) References Cited

U.S. PATENT DOCUMENTS

| | | | | |
|---|---|---|---|---|
| 5,712,585 A | * | 1/1998 | Jeong | 327/293 |
| 5,714,904 A | * | 2/1998 | Jeong | 327/407 |
| 5,982,309 A | * | 11/1999 | Xi et al. | 341/101 |
| 6,499,070 B1 | * | 12/2002 | Whetsel | 710/71 |

FOREIGN PATENT DOCUMENTS

| | | |
|---|---|---|
| JP | 03-026107 | 2/1991 |
| JP | 06-077792 | 3/1994 |
| JP | 06-244739 | 9/1994 |
| JP | 07-074654 | 3/1995 |
| JP | 08-070296 | 3/1996 |
| JP | 08-340259 | 12/1996 |
| JP | 09-055667 | 2/1997 |
| JP | 10-022837 | 1/1998 |

* cited by examiner

Primary Examiner—Patrick Wamsley
(74) Attorney, Agent, or Firm—Katten Muchin Zavis Rosenman (57) ABSTRACT

A parallel in serial out (PISO) circuit for converting inputted parallel data bits into a corresponding serial data is disclosed. In the case where the inputted parallel data bits is four, the PISO circuit includes a first latch group, which is provided with four flip-flops, for latching respectively the four data bits at the four flip-flops in synchronism with a clock of 50 MHz. A first selector group is further provided which includes two selectors each of which selectively receives two different data bits latched at the first latch group and each of which outputs sequentially the received two different data bits in synchronism with the clock of 50 MHz. A second latch group, which follows the first selector group, is provided with two flip-flops for latching the two data bits outputted form the two selectors of the first selector group in synchronism with a clock of 100 MHz. The PISO circuit further has a single selector selectively receiving the two data bits latched at the second latch group in synchronism with the clock of 100 MHz. A flip-flop, which is preceded by the single selector, latches the data bit outputted for the single selector in synchronism with a clock of 200 MHx. Thus, the four data bits inputted in parallel to the PISO circuit is converted into the corresponding serial data.

7 Claims, 12 Drawing Sheets

PARALLEL IN SERIAL OUT CIRCUIT HAVING FLIP-FLOP LATCHING AT MULTIPLE CLOCK RATES

BACKGROUND OF THE INVENTION

1. Field of the invention

The present invention relates generally to a parallel in serial out (PISO) circuit for use in a digital data communication system, and more specifically to a PISO circuit which is suitable for use in a physical layer defined by IEEE (Institute of Electrical and Electronic Engineers) 1394 standard.

2. Description of Related Art

In order to comply with the demand for large volume transfer of digital data at a high speed between a personal computer and a peripheral(s) byway of example, the IEEE 1394-1995 Standard for a High Performance Serial Bus (hereinafter sometimes referred to as 1394 serial bus) was developed. As is known in the art, the 1394 serial bus protocols are described as a set of three stacked layers: transaction layer, link layer and physical layer. Explaining these layers in brief, the transaction layer defines a complete request-response control to perform the bus transactions. The link layer provides a one-way (half-duplex) data transfer with confirmation of request service to the transaction layer, and further provides addressing, data checking, and date framing for packet transmission and reception. On the other hand, the physical layer translates the logical symbols used by the link layer into electrical signals, and defines the mechanical interfaces for the serial bus. More specifically, the physical layer has three primary functions: transmission and reception of data bits, arbitration, and provision for the electrical and mechanical interface.

Before turning to the present invention, it is deemed preferable to briefly describe, with reference to FIGS. 1–6 (C), prior art to which the present invention is applicable.

Figure 1:
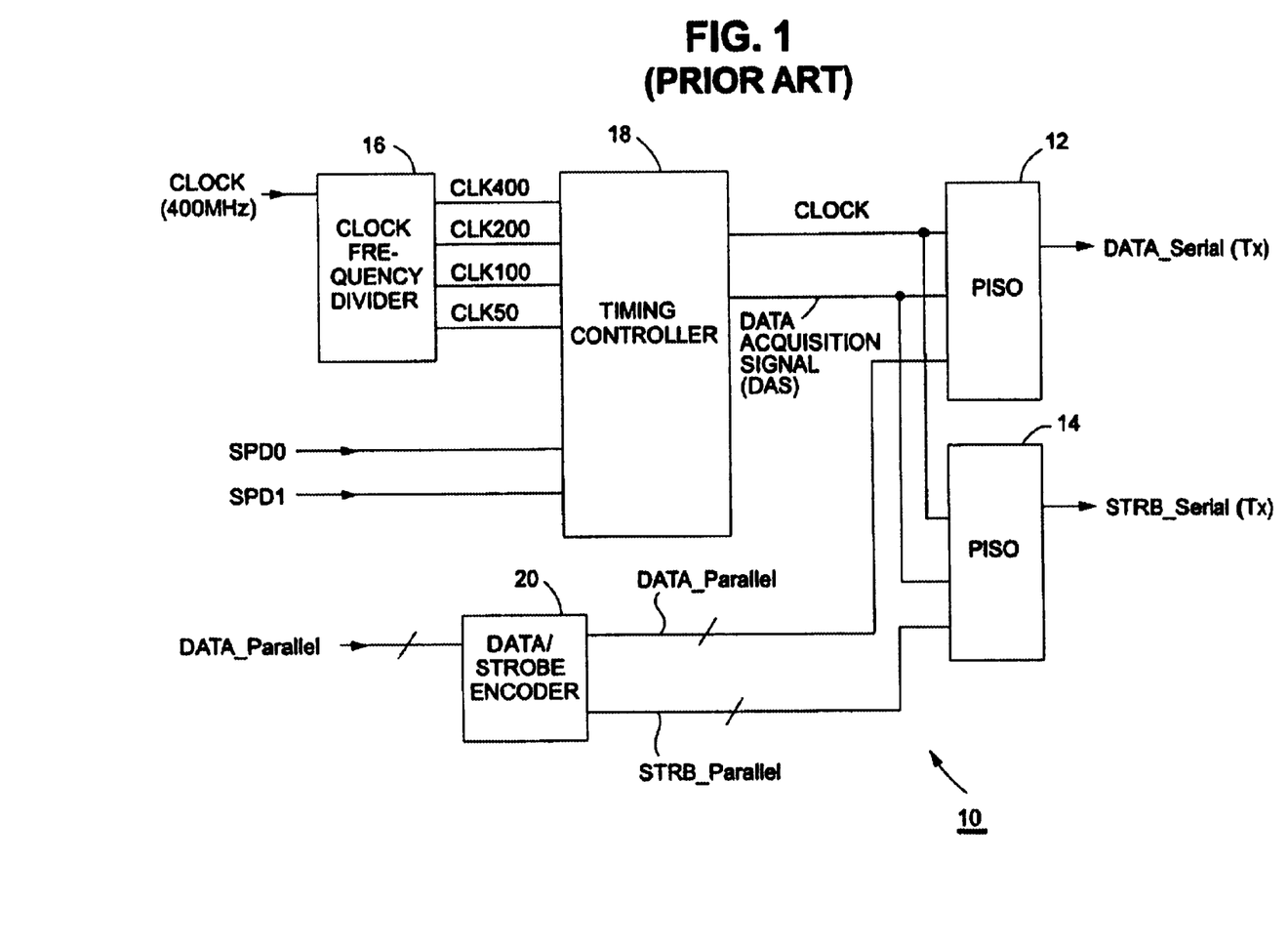
FIG. 1 is a block diagram schematically showing a conventional data transfer circuit provided in the physical layer defined by the IEEE 1394 standard, having been referred to in the opening paragraphs in the instant disclosure.

Referring to FIG. 1, a conventional data transfer circuit (denoted by 10) is schematically shown in block diagram form, which circuit is provided in the physical layer. As shown, the data transfer circuit 10 generally comprises a parallel in serial out (PISO) circuits 12 and 14, a clock frequency divider 16, a timing controller 18, and a data'strobe encoder 20, all of which are coupled as illustrated.

According to the IEEE 1394 protocol, the data transfer speed is selected among 400, 200 and 100 Mbps (Mega-bit per second). The cock frequency divider 16, which takes the form of 3-stage counter using three flip-flops (FFs), receives a 400 MHz clock, and divides the same so as to output three different clocks that have respectively clock rates of 200 MHz, 100 MHz, and 50 MHz. In addition, the clock frequency divider 16 allows the inputted 400 MHz clock to pass therethrough. That is to say, the clock frequency divider 16 issues the four different clocks of 400 MHz, 200 MHz, 100 MHz and 50 MHz, all of which are applied to the timing controller 18. These clocks are respectively denoted by CLK400, CLK200, CLK100, and CLK50 in the instant disclosure.

The data/strobe encoder 20 is supplied with a parallel data DATA_Parallel of 8 bits (in the instant case) to be transmitted in serial, and outputs two parallel data: one is a parallel data DATA_Parallel which is exactly the same as the inputted parallel data; and the other is a parallel strobe signal STRB_Parallel. These parallel data DATA_Parallel and STRB_Parallel are applied to each of the PISO circuits 12 and 14. Although not shown in FIG. 1, the parallel data (8 bits) are respectively numbered 0, 1, 2, . . . , 7 in order of sequential transmission from each of the PISO circuits 12 and 14. The parallel strobe signal STRB_Parallel is produced by simply reversing a logic level of each of the odd number data bits (viz., data bits respectively numbered 1, 3, 5, and 7) of the parallel data of DATA_Parallel.

As mentioned above, according to the IEEE 1394 standard, two serial data DATA_Serial (Tx) and STRB_Serial (Tx), which are respectively outputted from the PISO circuits 12 and 14, are transmitted at the transfer speed of 400, 200, or 100 Mbps using a lock rate of 400 MHz, 200 MHz, or 100 MHz. In order to select one of these clock rates, the timing controller 18 is supplied with data transfer speed control signals SPD0 and SPD1, and also receives the above-mentioned four clocks CLK400, CLK200, CLK100, and CLD50. The speed control signals SPD0 and SOD1 will further be described later.

Figure 2:
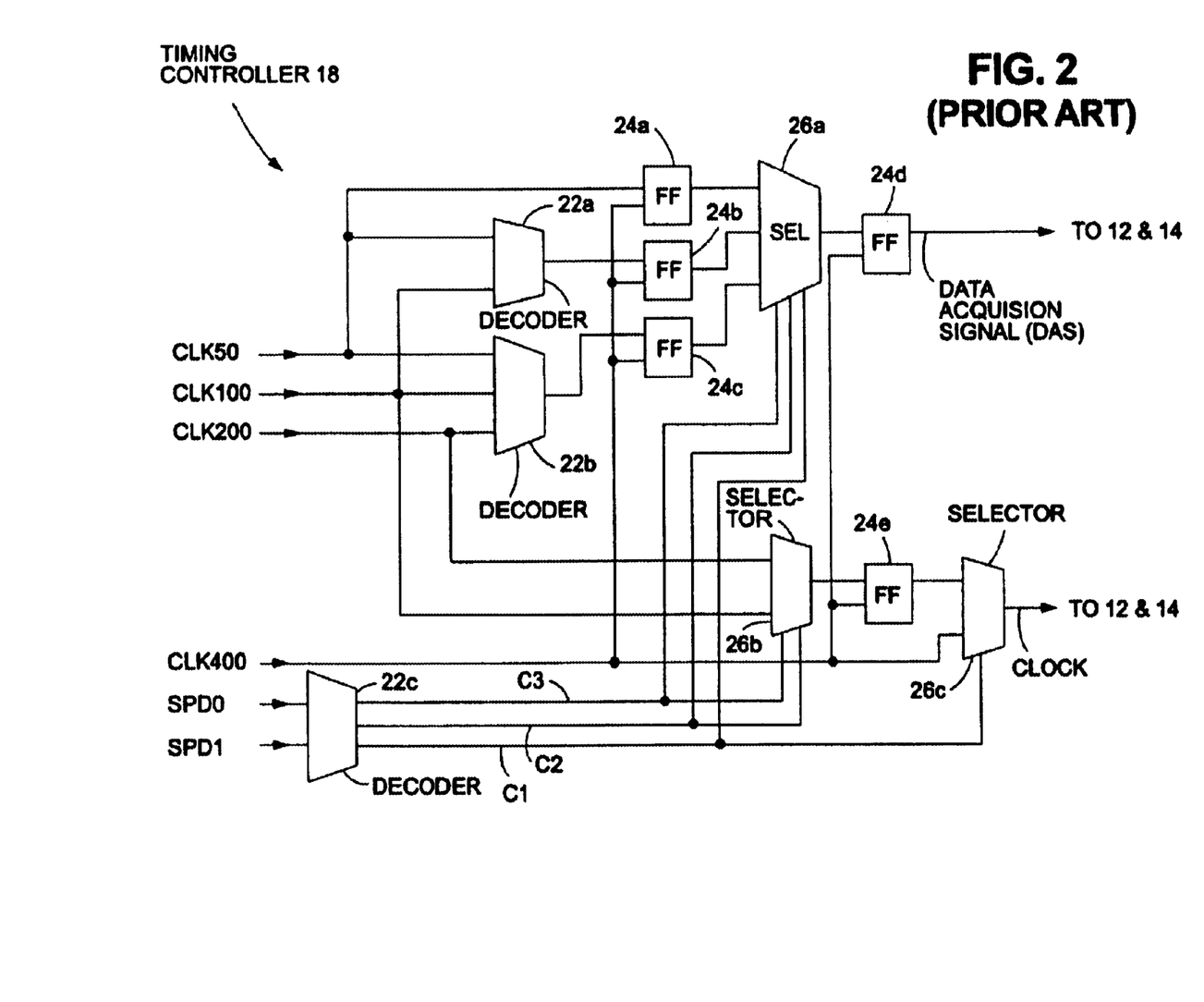
FIG. 2 is a block diagram showing one block of FIG. 1 in detail.

Referring to FIG. 2, the timing controller 18 of FIG. 1 is shown in detail in block diagram form. As shown in FIG. 2, the timing controller 18 comprises decoders 22a–22c, flip-flops (FFs) 24a–24e, and selectors 26a–26c, all of which are coupled as shown. As mentioned above, the controller 18 is supplied with the four locks CLK400, CLK200, CLK100, and CLK50, and further receives the data transfer speed control signals SPD0 and SPD1 from logic circuitry (not shown) provided in the physical layer. The timing controller 18 per se is not directly concerned with the present invention, and hence, only the brief description thereof will be given for the sake of simplifying the instant disclosure. The decoder 22c receives the data transfer speed control signals SPD0 and SPD1, and issues data transfer speed control signals C1–C3. The control signal C1 is applied to the selectors 26a and 26c, while the control signals C2 and C3 are both applied to each of the selectors 26a and 26b.

The timing controller 18 can be divided into two sections in terms of function thereof. That is, the first section includes the flip-flop 24e and the selectors 26b–26c, while the second section includes the decodes 22a–22b, the flip-flops 24a–24d, and the selector 26a. When both of the data transfer speed signals SPD0 and SPD1 is non-active, the output of the selector 26c of the first section becomes CLK400 (400 MHz), and the output of the flip-flop 24d is 50 MHz (viz., one eight of 400 MHz). Further, when only SPD1 becomes active, the output of the selector 26c is CLK200 (200 MHz) and at the same time, the output of the flip-flop 24d is 25 MHz. Still further, when only SPD0 becomes active, the output of the selector 26c becomes CLK100, and at the same time, the flip-flop 24d becomes 12.5 MHz. The clock and the data acquisition signal thus generated are both applied to the PISO circuits 12 and 14.

Figure 3:
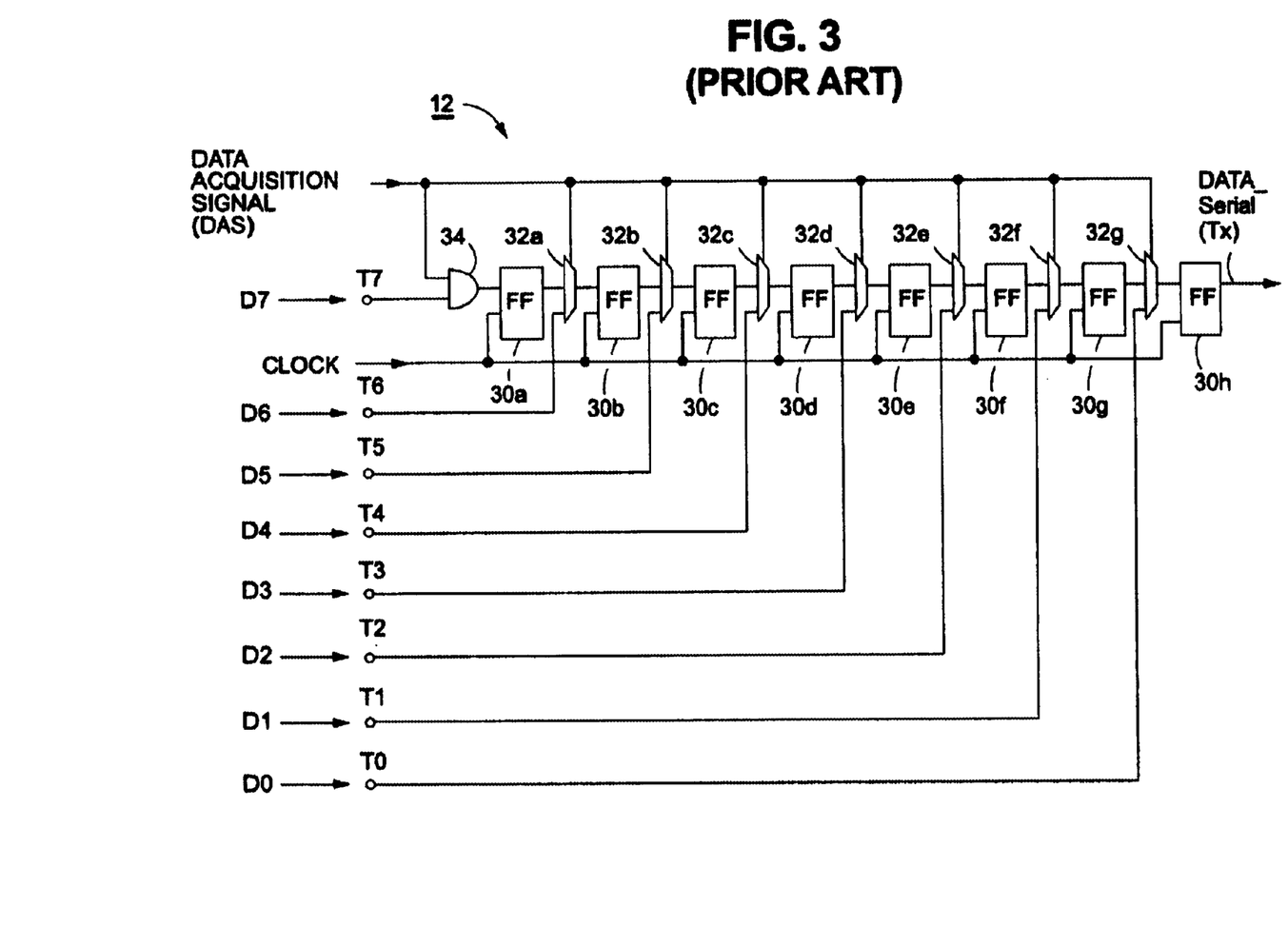
FIG. 3 is a block diagram showing a PISO circuit of FIG. 1.

FIG. 3 is a diagram showing the PISO circuit 12 in detail. It is to be noted that the other PISO circuit 14 is configured in exactly the same manner as the PISO circuit 12. The PISO circuit 12 is a conventional type 8-bit shift register which is configured by eight flip-flops 30a–30h, selectors 32a–32g, and an AND gate 34. A clock signal (400 MHz, 200 MHz, or 100 MHz) is applied t the clock terminals of the flip-fops 30a–30h. Data bits D0–D6 are respectively applied to the selectors 32a–32g by way of input terminals T0–T6, and on the other hand, a data bit D7 is applied to the AND gate 34 via an input terminal T7. When the data acquisition signal DAS is applied to the PISO circuit 12, the flip-flops 30a–30h acquire respectively the outputs of the preceding circuits. The contents of the flip-flops 30a–30h are then shifted in synchronism with the clock until the data bit D7 is outputted from the flip-flop 30*h*, and thereafter, these operations are repeated on the following eight parallel data (viz., D8–D15).

Figure 4:
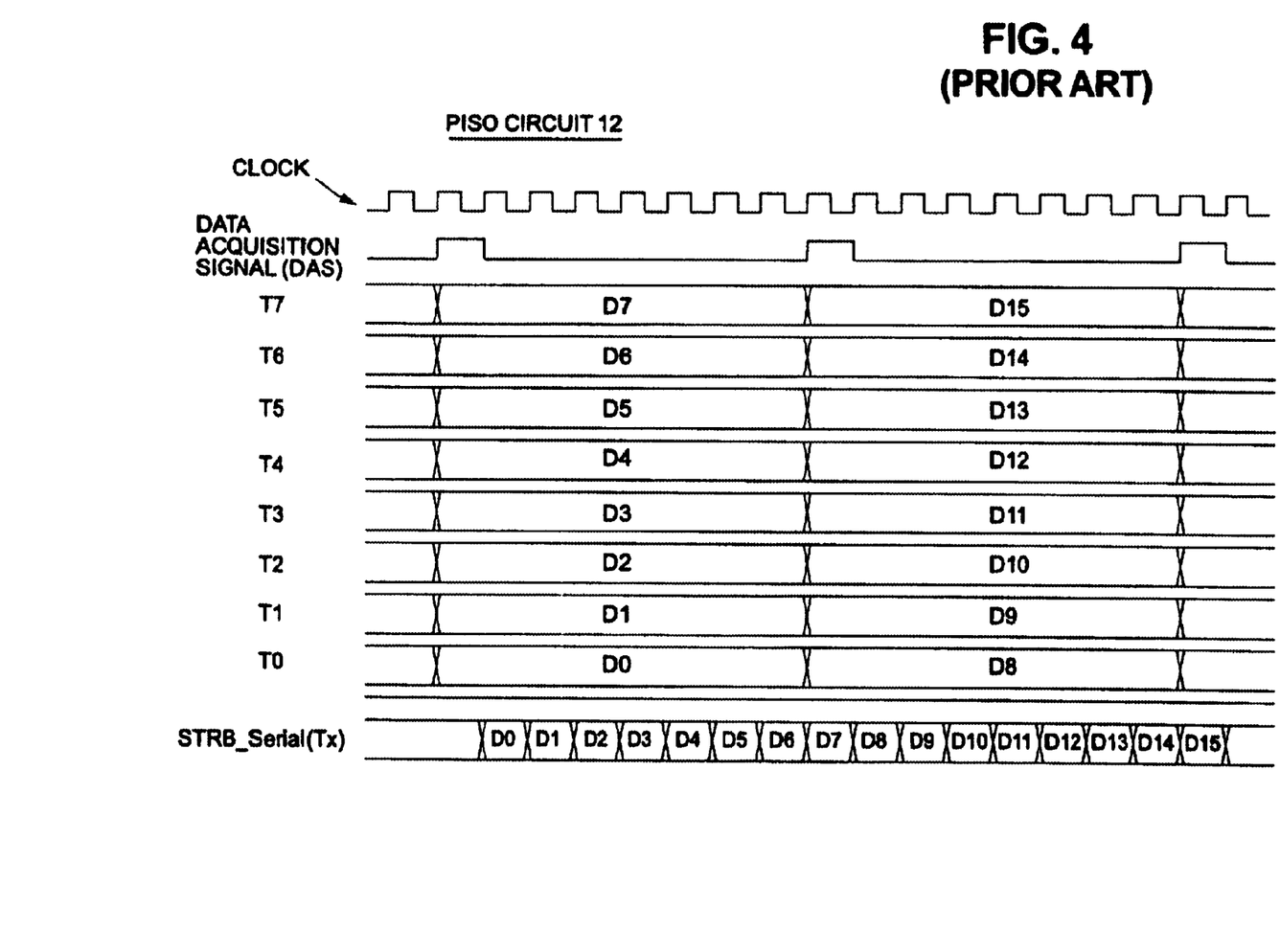
FIG. 4 is a timing chart for describing the operation of the PISO circuit of FIG. 3.

FIG. 4 is a timing chart graphically showing the above-mentioned operation of the PISO circuit 12. It is clearly understood that the first 8-bit parallel data D0–D7 are acquired at the flip-flops 30*a*–30*h* at a time in response to the data acquisition signal DAS, after which the PISO circuit 12 outputs in series D0–D7 in synchronism with the clock as DATA_Serial (Tx), and thereafter, the same operation is carried out on the following 8-bit parallel data D8–D15.

Figure 5:
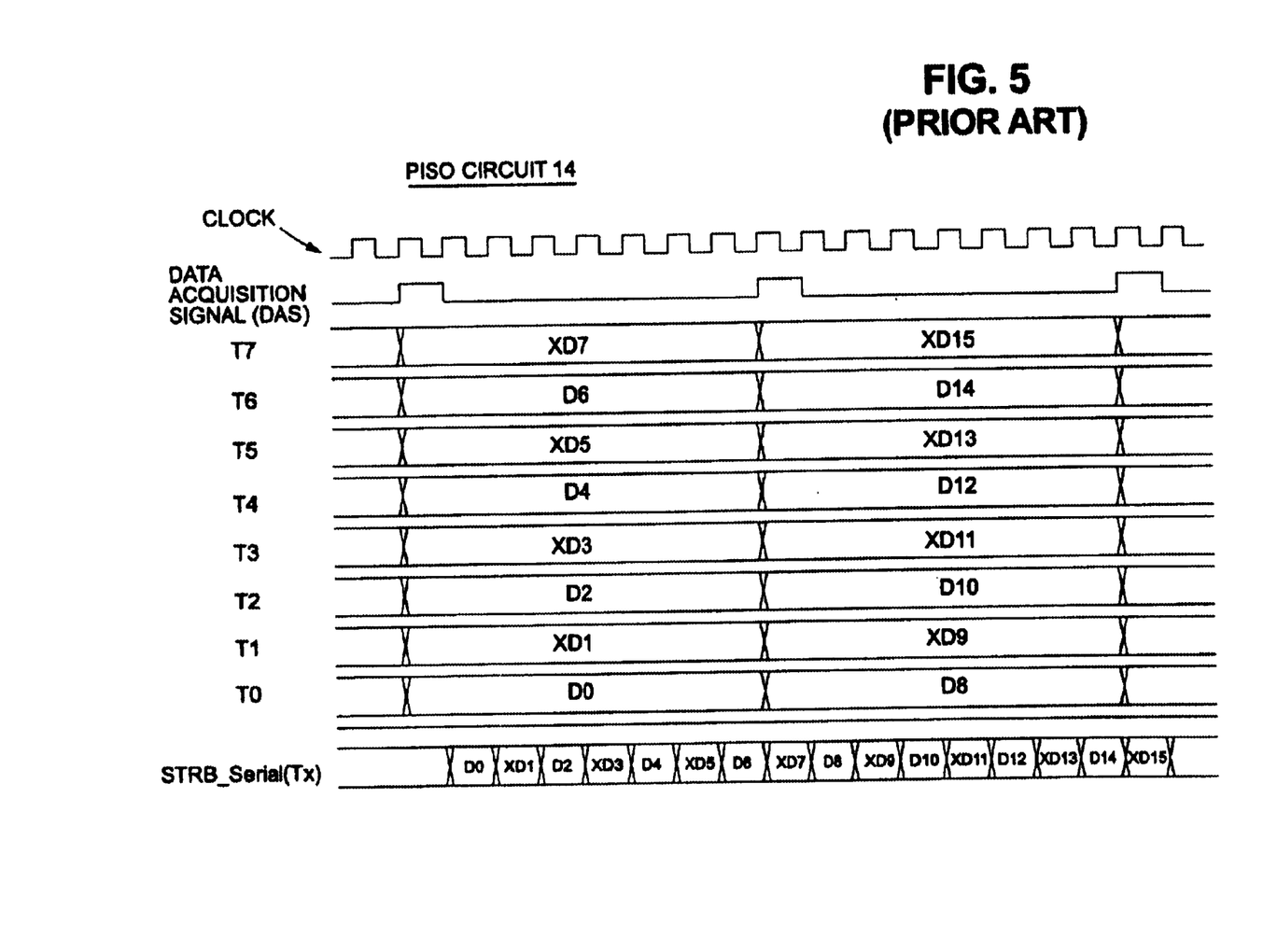
FIG. 5 is a timing chart for describing the operation of another PISO of FIG. 1.

FIG. 5 is a timing chart showing the operation of the other PISO circuit 14. As mentioned above, the parallel strobe data STRB_Parallel differs from the corresponding parallel data DATA_Parallel only with respect to the fact that the odd number data bits of DATA_Parallel (viz., data bits respectively number 1, 3, 5, . . . ) are reversed in terms of logic level. In FIG. 5, the character "X" attached to each of the data bits such as D1, D3, etc. denotes that the logic level of each of the data bits D1, D3, . . . etc. of DATA_Parallel is reversed. Accordingly, the timing chart of FIG. 5 is readily understood when referring to that of FIG. 4, and hence, further description of the timing chart of FIG. 5 will be omitted for the sake of simplifying the instant disclosure.

Figure 6A:
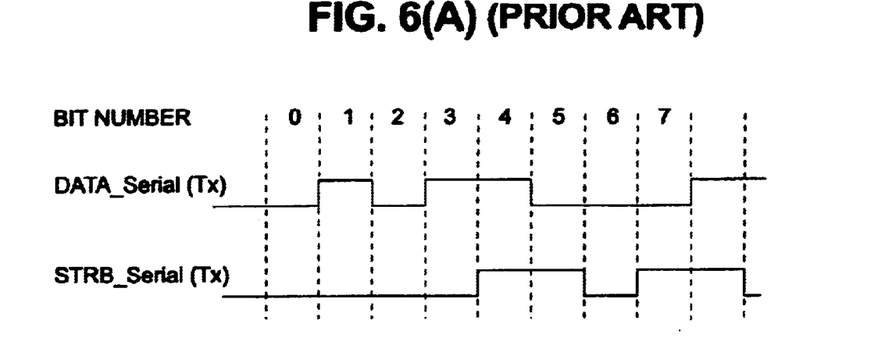
FIG. 6(A) is a timing chart showing outputs of two PISO circuits of FIG. 1.

FIG. 6(A) is a timing chart schematically showing DATA_Serial (Tx) and STRB_Serial (Tx) which are respectively outputted from the. PISO circuits 12 and 14. As shown, the logic level of each of the data bits at the odd bit numbers 1, 3, 5, and 7 of STRB_Serial (Tx) are reversed with respect to the corresponding data bits of DATA_Serial (Tx).

Figure 6B:
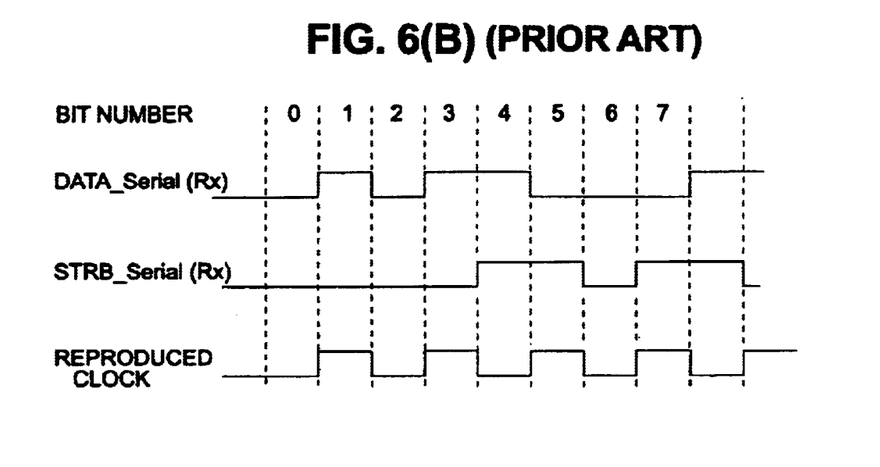
FIG. 6(B) is a timing chart for describing clock reproduction at a data receiving side.

FIG. 6(B) is a timing chart schematically showing a dock which is reproduced by performing exclusive-OR operation of DATA_Serial (Rx) and STRB_Serial (Rx) received at a given node (e.g., a certain periphery coupled to a personal computer (for example)). The reproduction of the clock using the received DATA_Serial (Rx) and STRB_Serial (Rx) is to improve the skew tolerance of data bits transferred across the serial bus.

The prior art thus far described has encountered the difficulty that the power consumption of the data transfer circuit 10 is undesirably high in that a large number of the flip-flops operable at the high frequency of 400 MHz are provided. In more specific terms, the clock frequency divider 16 is provided with three flip-flops operating at the 400 MHz clock, and further, the timing controller 18 requires the five flip-flops which are configured such as to operate at 400 MHz. Still further, each of the PISO circuits 12 and 14 contains eight flip-flops operable at 400 MHz. Summing up, there are 24 (twenty four) flip-flops in total in the data transfer circuit 10, each of which is operable at 400 MHz. Accordingly, if the circuit 10 operates such as to output DATA_Serial and STRB_Serial at 400 MHz, then the power consumption becomes objectionable when the circuit 10 is fabricated on a semiconductor chip.

Figure 6C:
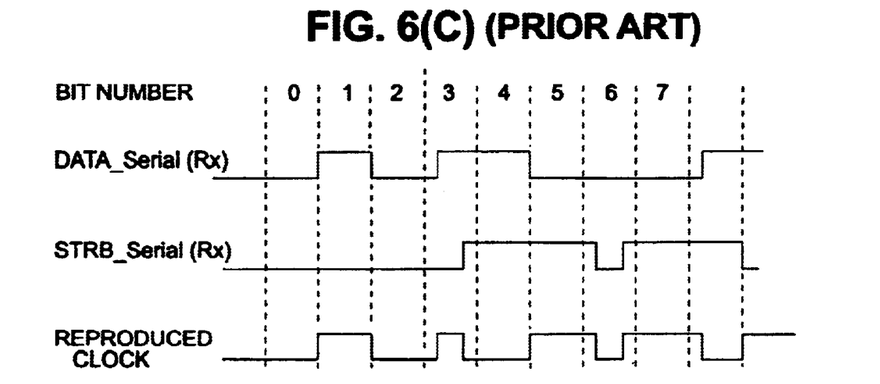
FIG. 6(C) is a timing chart for describing the problem that tends to occur with the prior art.

One approach to overcoming the above-mentioned problem is disclosed in Japanese Laid-open Patent Application No 10-22837. According to this prior art, two selectors are provided for respectively converting 8-bit parallel data and 8-bit parallel strobe into the corresponding two 8-bit serial data. This prior art utilizes eight switches in place of eight flip-flops in a shift-register, wherein each switch is designed so as to operate at a high frequency, and as such, it is expected to reduce the overall power consumption of the data transfer circuit. However, the switches disclosed in the prior art in question are directly coupled at the outputs thereof, and thus die signals generated therefrom tend to be adversely affected by the existence of the output wire load and the output capacitance of each of the switches. Consequently, the rising and falling edges of each of the output pulses is apt to be deteriorated, leading to the fact that jitters are liable to occur in each of the received DATA_Serial (Rx) and STRB_Serial (Rx). The jitters in turn cause skews between DATA_Serial (Rx) and STRB_Serial (Rx), which renders it difficult to correctly reproduce the clock because the duty cycles of the pulses may be considerably different with each other as shown in FIG. 6(C).

SUMMARY OF THE INVENTION

It is therefore an object of the present invention to provide a PISO circuit via which the power consumption can effectively be realized while correctly reproducing a clock at a data receiving side (node).

In brief, the object is achieved by a parallel in serial out (PISO) circuit for converting inputted parallel data bits into a corresponding serial data is disclosed. In the case where the inputted parallel data bits is four, the PISO circuit comprises a first latch group, which is provided with four flip-flops, for latching respectively the four data bits at the four flip-fops in synchronism with a clock of 50 MHz. A first selector group is further provided which comprises two selectors each of which selectively receives two different data bits latched at the first latch group and each of which outputs sequentially the received two different data bits in synchronism with the clock of 50 MHz. A second latch group, which follows the first selector group, is provided with two flip-flops for latching the two data bits outputted from the two selectors of the first selector group in synchronism with a clock of 100 MHz. The PISO circuit further comprises a single selector for selectively receiving the two data bits latched at the second latch group in synchronism with the clock of 100 MHz. A flip-flop, which is preceded by the single selector, latches the data bit outputted from the single selector in synchronism with a clock of 200 MHz. Thus, the four data bits inputted in parallel to the PISO circuit is converted into the corresponding serial data.

One aspect of the present invention resides in a parallel in serial out circuit for converting $2^r$ data bits (r is a natural number) applied thereto in parallel into a corresponding serial data, comprising: first to (r+1)-th latch means wherein the s-th ($1 \leq s \leq r+1$) latch means comprises $2^{r+1-s}$ flip-flops; first to r-th selector means respectively provided between adjacent two of the first to (r+1)-th latch means; wherein the t-th latch means ($1 \leq t \leq r$) is provided such as to latch $2^{r+1-t}$ data bits in synchronism with a clock signal of $2^{t-2} \times 100$ MHz, and the (r+1)-th latch means is provided to latch a single data bit in synchronism with a clock signal of $2^{r+1-} 2 \times 100$ MHz, and wherein the u-th selector means ($1 \leq u \leq r$) is provided with $2^{r-u}$ selectors each of which receives two different data bits outputted from the u-th latch means and generates sequentially the received two different data bits in synchronism with a clock signal of $2^{u-2} \times 100$ MHz.

Another aspect of the present invention resides in a parallel in serial out circuit for converting four data bits applied thereto in parallel into a corresponding serial data, comprising: first latch means, which is provided with four flip-flops, for latching respectively the four data bits at the four flip-flops in synchronism with a clock of 50 MHz: first selector means comprising two selectors each of which selectively receives two different data bits latched at the first latch means and each of which outputs sequentially the received two different data bits in synchronism with the clock of 50 MHz: second latch means, which is provided with two flip-flops, for latching the two data bits outputted from the two selectors of the first selector means in synchronism with a clock of 100 MHz; second selector means comprising a single selector for selectively receiving the two data bits latched at the second latch means in synchronism with the clock of 100 MHz; and a flip-flop for latching the data bit outputted from the single selector in synchronism with a clock of 200 MHz.

Still another aspect of the present invention resides in a parallel in serial out circuit for converting eight data bits applied thereto in parallel into a corresponding serial data, comprising: first latch means, which is provided with eight flip-flops, for latching respectively the eight data bits at the eight flip-flops in synchronism with a clock of 50 MHz; first selector means comprising four selectors each of which selectively receives two different data bits latched at the first latch means and each of which outputs sequentially the received two different data bits in synchronism with the clock of 50 MHz; second latch means, which is provided with four flip-flops for latching respectively the four data bits outputted from the four selectors of the first selector means at the four flip-flops in synchronism with a clock of 100 MHz; second selector means comprising two selectors each of which selectively receives two different data bits latched at the second latch means and each of which outputs sequentially the received two different data bits in synchronism with the clock of 100 MHz; third latch means, which is provided with two flip-flops, for latching respectively the two data bits outputted from the two selectors of the second selector means in synchronism with a clock of 200 MHz; third selector means comprising a single selector for selectively receiving two different data bits latched at the third latch means in synchronism with the clock of 200 MHz and a flip-flop for latching the data bit outputted from the single selector in synchronism with a clock of 400 MHz.

Still another aspect of the present invention resides in a parallel in serial out circuit for converting sixteen data bits applied thereto in parallel into a corresponding serial data, comprising: first latch means, which is provided with sixteen flip-flops, for latching respectively the sixteen data bits at the sixteen flip-flops in synchronism with a clock of 50 MHz; first selector means comprising eight selectors each of which selectively receives two different data bits latched at the first latch means and each of which outputs sequentially the received two different data bits in synchronism with the clock of 50 MHz second latch means, which is provided with eight flip-flops, for respectively latching the eight data bits outputted from the eight selectors of the first selector means at the eight flip-flops in synchronism with a clock of 100 MHz; second selector means comprising four selectors each of which selectively receives two different data bits latched at the second latch means and each of which outputs sequentially the received two different data bits in synchronism with the clock of 100 MHz; third latch means, which is provided with four flip-flops, for latching respectively the four data bits outputted from the four selectors of the second selector means at the four flip-flops in synchronism with a clock of 200 MHz third selector means comprising two selectors each of which selectively receives two different data bits latched at the third latch means and each of which outputs sequentially the received two different data bits in synchronism with the clock of 200 MHz; fourth latch means, which is provided with two flip-flops for latching respectively the two data bits outputted from the two selectors of the third selector means in synchronism with a clock of 400 MHz; fourth selector means comprising a single selector for selectively receiving two different data bits latched at the fourth latch means in synchronism with the clock of 400 MHz; and a flip-flop for latching the data bit outputted from the single selector in synchronism with a clock of 800 MHz

BRIEF DESCRIPTION OF THE DRAWINGS

The features and advantages of the present invention will become more clearly appreciated from the following description taken in conjunction with the accompanying drawings in which like elements or portions are denoted by like reference numerals and in which.

DETAILED DESCRIPTION OF THE PREFERRED EMBODIMENTS

A preferred embodiment of the present invention and the modifications thereof will be described with reference to FIGS. 7 to 12.

Figure 7:
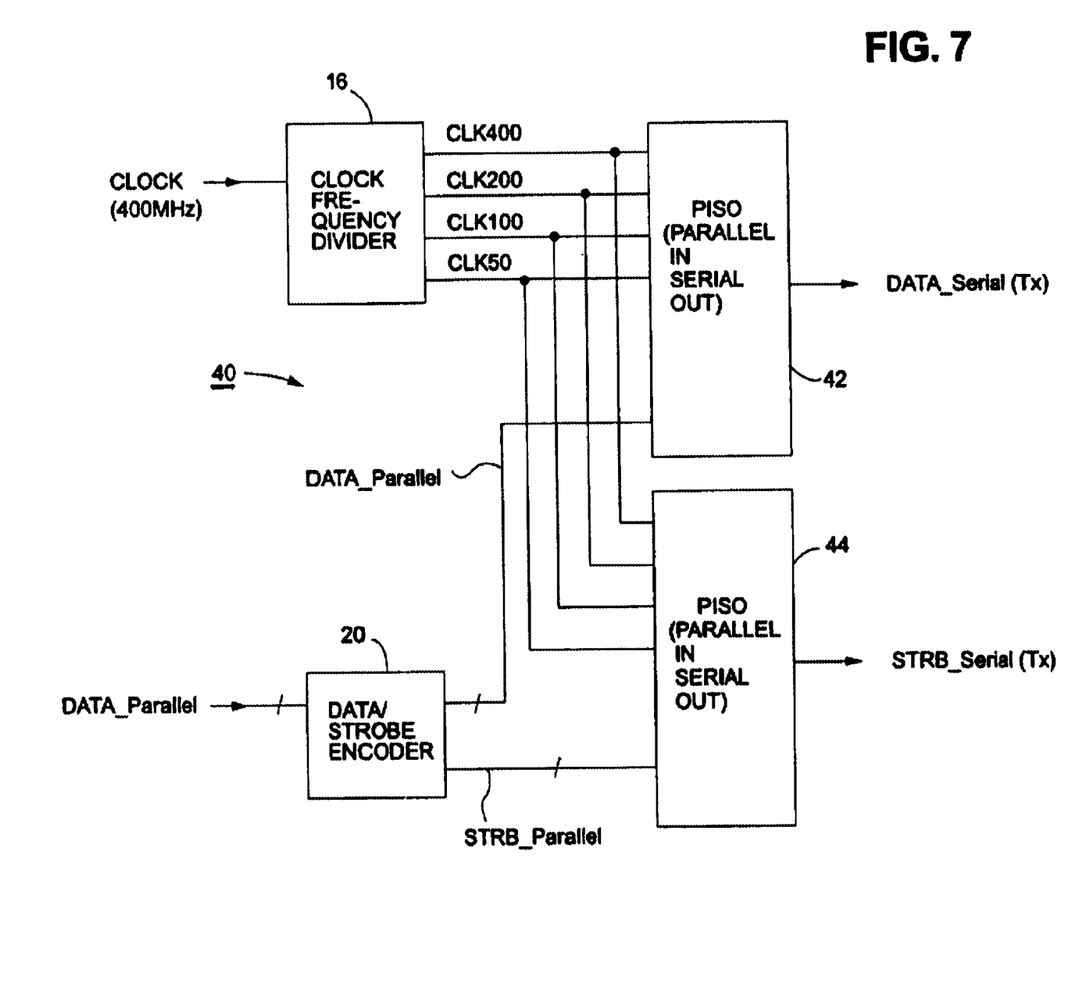
FIG. 7 is a diagram schematically showing a data transfer circuit including PISO circuits according to the preferred embodiment of the present invention.

Referring first to FIG. 7, a data transfer circuit (denoted by 40) is schematically shown in block diagram form, which circuit 40 comprises PISO circuits 42 and 44 embodying the present invention. The blocks other than this are substantially the same as the counterparts shown in FIG. 1, and thus, the blocks already referred to in the opening paragraphs are represented by like reference numerals, and the description thereof will be omitted except for becoming necessary in context in order to simplify the instant disclosure.

One advantage derived from the first embodiment is to render it unnecessary to provide the timing controller 18 of FIG. 1, via which the number of flip-flops operating at the high frequency such as 400 MHz in the data transfer circuit 40 can effectively reduced. The other advantage of the preferred embodiment will be referred to latter.

Figure 8:
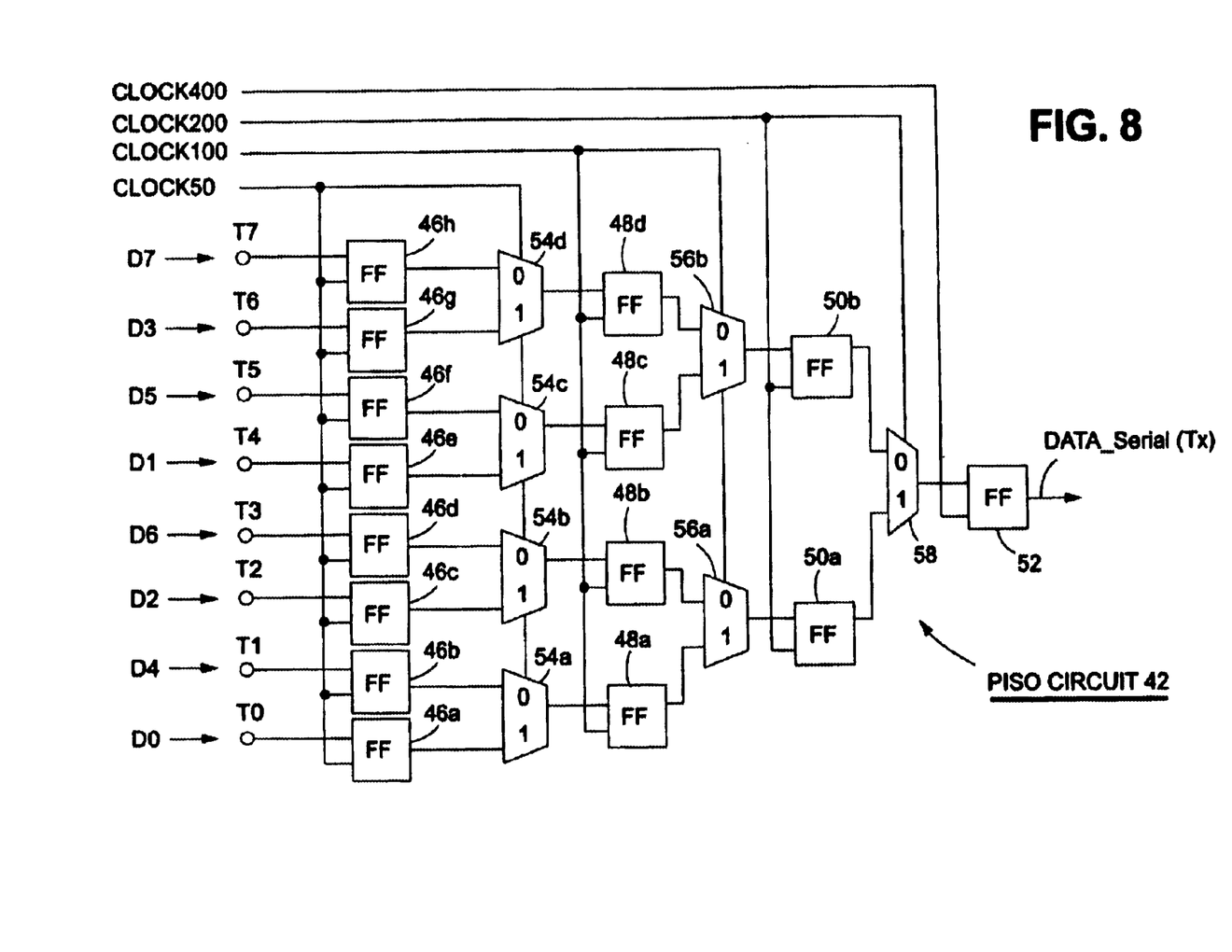
FIG. 8 is a diagram showing in detail one of the PISO circuits of FIG. 7.

FIG. 8 is a diagram showing the detail of the PISO circuit 42 of FIG. 7, which is supplied with the 8-bit parallel data DATA_Parallel (D0–D7) and converts the same into the corresponding 8-bit serial data. As shown in FIG. 8, the PISO circuit 42 comprises a first latch group (or means) consisting of eight flip-flops 46a–48h, a second latch group consisting of four flip-flops 48a–48d, a third latch group consisting of two flip-flops 50a–50b, and a latch (fourth latch means) or flip-flop 52. Further, the PISO circuit 42 comprises a first selector group (or means) consisting of four selectors 54a–54d, a second selector group consisting of two selectors 56a–56b, and a selector 58. The PISO circuit 42 is supplied with the clocks CLK50, CLK100 CLK200 and CLK400, whose clock rates are respectively 50 MHz, 100 MHz, 200 MHz and 400 MHz as mentioned in the opening paragraphs. Further, the PISO circuit 42 receives or latches the eight (8) parallel data bits D0–D7 at the first latch group (flip-flops 46a–4h) applied thereto via input terminals T0–T7.

The numbers 0 to 7 attached to "Ds" of parallel data bits D0–D7 denote the serial data bits outputted in this order from the PISO circuit 42. That is, the parallel data D0–D7 are sequentially outputted in this order from the PISO circuit 42 as DATA_Serial (Tx). It is to be noted that, in order to serially output the parallel data D0–D7 in this order, the order of the parallel data bits D0–D7 applied to the first latch group are arranged such that D0, D4, D2, D6, D1, D5, D3, and D7 of the parallel data bits are respectively applied to the flip-flops 46a–46h in the case shown in FIG. 8.

Each of the selectors 54a–54d, 56a–56b, and 58 is provided with two inputs denoted by "1" and "0". When the clock applied to the selector assumes a high level, the selector, in response to the high level, selects data bit applied to the input "1" and relays the selected data bit to the following latch (viz., flip-flop). Contrarily, when the clock applied to the selector assumes a low level, the selector, in response to the low level, selects data bit applied to the input "0" and relays the selected data bit to the following latch.

Figure 9:
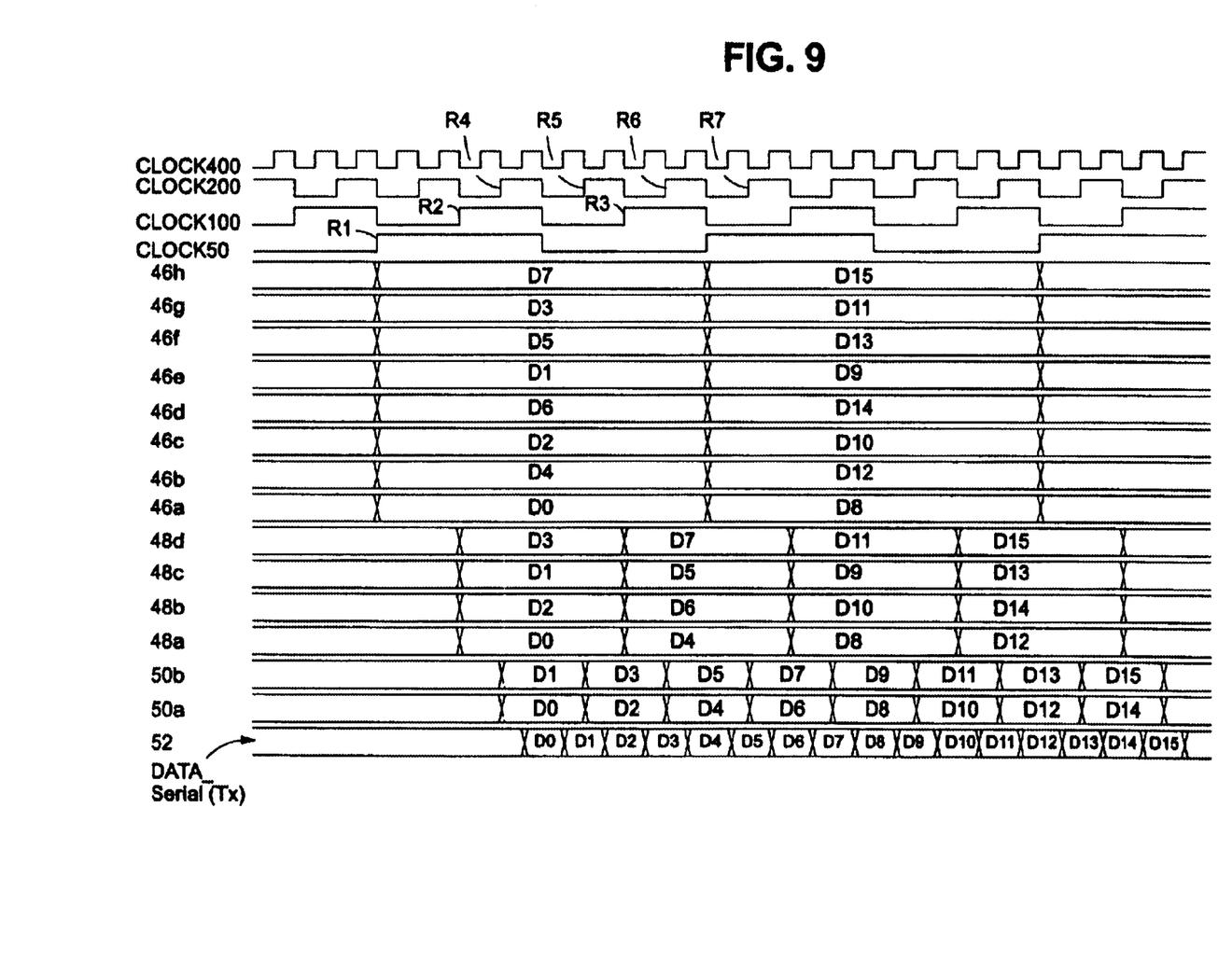
FIG. 9 is a timing chart for describing the operation of the PISO circuit of FIG. 8.

The operation of the PISO circuit 42 will be described with reference to FIG. 9. The flip-flops 46a–46h latch respectively the data bits D0, D4, D2, D6, D1, D5, D3 and D7 at a time in synchronism of the clock CLK 50 (50 MHz) and hold them during one cycle thereof. In other words, the data bits D0–D7 are acquired into the flip-flops 46a–46h at a rising (leading) edge R1 of the clock CLK50. On the other hand, the selectors 54a–54d select respectively the data bits applied to the input "1"s thereof while the clock CLK 50 takes a high level and then outputs the selected data bits. Thereafter, the selectors 54a–54d select respectively the data bits applied to the input "0"s thereof while the clock CLK 50 takes a low level and then outputs the selected data bits.

The flip-flops 48a–48d, which are respectively preceded by the selectors 54a–54d, latch respectively the data bits D0–D3 at a rising edge R2 of the clock CLK100 at a time, and hold them during one cycle. Subsequently, the flip-flops 48a–48d latch respectively the data bits D4–D7 at a rising edge R3 of the clock CLK100, and hold them during one cycle.

In a similar manner, the selectors 56a–56d select respectively the data bits applied to the input "1"s thereof while the clock CLK 100 takes a high level and then outputs the selected data bits. Subsequently, the selectors 56a–56b select respectively the data bits applied to the input sons thereof while the clock CLK 100 takes a low level and then outputs the selected data bits.

The flip-flops 50a–50b, which are respectively preceded by the selectors 56a–56b, latch respectively the data bits D0–D1 at a time at a rising edge R4 of the clock CLK200, and hold them during one cycle. Subsequently, the flip-flops 50a–50b latch respectively the data bits D2–D3 at a rising edge R5 of the clock CLK200, and hold them during one cycle. Likewise, the other data bits D4–D5 and D6–D7 are respectively acquired into the flip-flops 55a–50b at rising edges R6 and R7.

The selector 58 selects the data bit applied to the input "1" thereof while the clock CLK 200 takes a high level, and then outputs the selected data bit. Subsequently, the selector 58 selects the data bit applied to the input "0" thereof while the clock CLK 200 takes a low level, and then outputs the selected data bit.

Lastly, the flip-flop 52 latches subsequently the outputs of the preceding selector 58 at the rising edges of the clock CLK400, and thus, generates the serial DATA_Serial (Tx) in the order of D0–D7. The above-mentioned operations are performed on the following 8-bit parallel data D8–D15.

Figure 10:
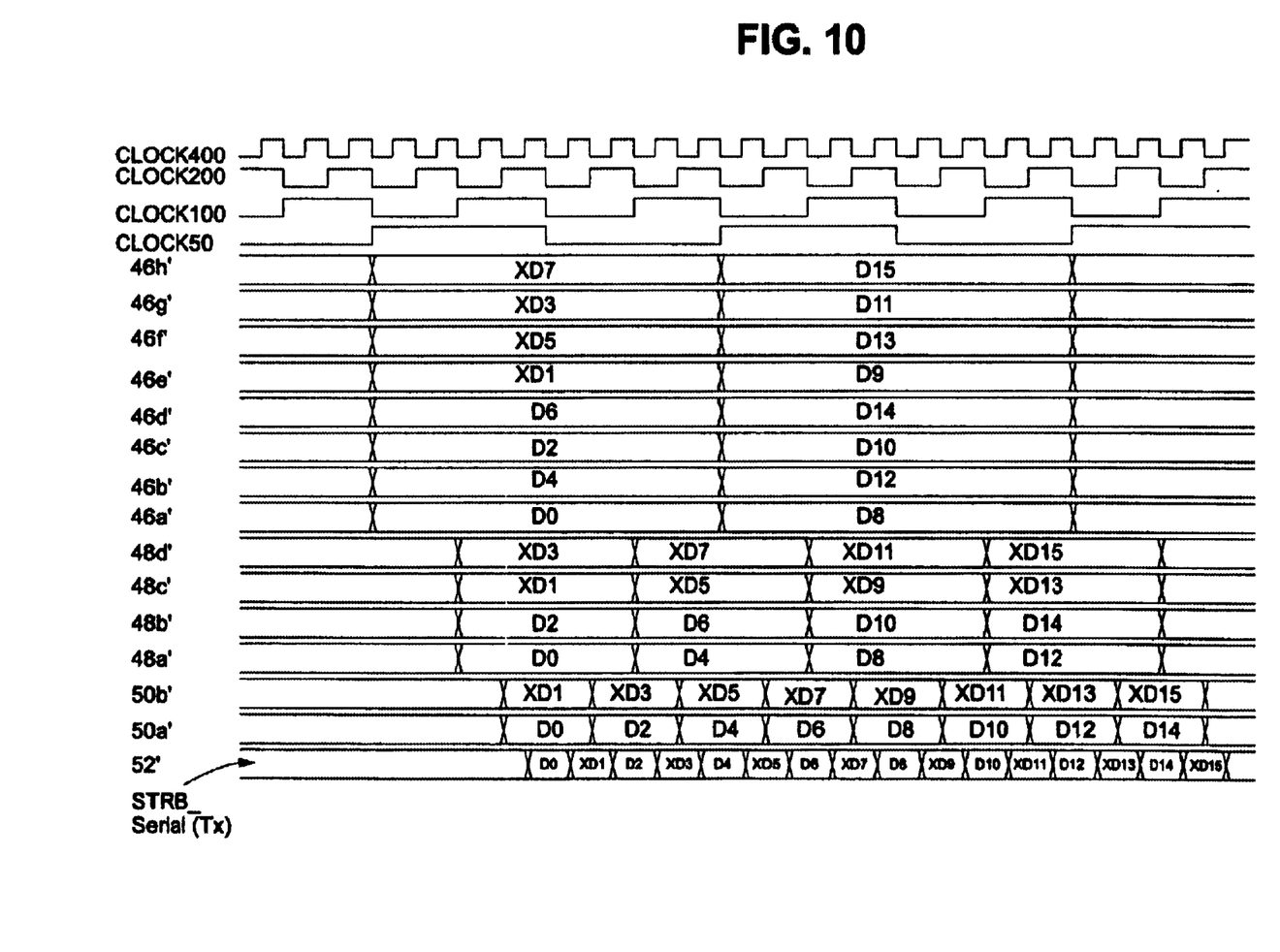
FIG. 10 is a timing chart for describing the operation of another PISO of FIG. 8.

FIG. 10 is a timing chart showing the operation of the other PISO circuit 44 which is configured in exactly the same manner as the PISO 42 and which generates a serial strobe signal STRB_Serial (Tx). Reference symbols 46h', 46g', . . . 52' appearing at the leftmost portions indicate flip-flops (although not shown) corresponding to the flip-flops 46h, 46g, . . . , 52 shown in FIG. 8. As mentioned above, the parallel strobe data STRB_Parallel applied to the PISO circuit 44 differs from the corresponding parallel data DATA_Parallel only with respect to the fact that the odd number data bits of DATA_Parallel (viz., data bits respectively number 1, 3, 5, . . . ) are reversed in terms of logic level. In FIG. 10, the character "X" attached to each of the data bits such as D1, D3, etc. denotes that the logic level of each of the data bits D1, D3 . . . etc. of DATA_Parallel is reversed. Accordingly, the timing chart of FIG. 10 is readily understandable when referring to that of FIG. 9, and hence, further description of the timing chart of FIG. 10 will be omitted for the sake of simplifying the instant disclosure.

It is understood from the foregoing that the number of flip-flops operating at the high frequency of 400 MHz can drastically be reduced with each of the PISO circuits 42 and 44. That is, each of the PISO circuit 42 and 44 is provided with only one flip-flop 52 operating at 400 MHz, two flip-flops 50a–50b operating at 200 MHz, four flip-flops 48a–48d operating at 100 MHz, and eight flip-flops 46a–46h operating at 50 MHz. If the above-mentioned flip-flops are converted into the flip-flops operating at the clock of 400 MHz, the number of such flip-flops becomes four. Although the number of the flip-flops provided in the clock frequency divider 16 and the data/strobe encoder 20 remains unchanged between the arrangements of FIGS. 1 and 7, the experiment conducted by the inventor reveals that the power consumption of the data transfer circuit 40 of FIG. 7 can be reduced by approximately 26% relative to that of the data transfer circuit 10 shown in FIG. 1.

Further, the PISO circuit 42 is provided with the flip-flop 52 at the final stage. Therefore, even if skew occurs between DATA_Serial and STRB_Serial at a data receiving side, the skew can be removed without difficulty by adjusting the timing of the clock CLK400.

Figure 11:
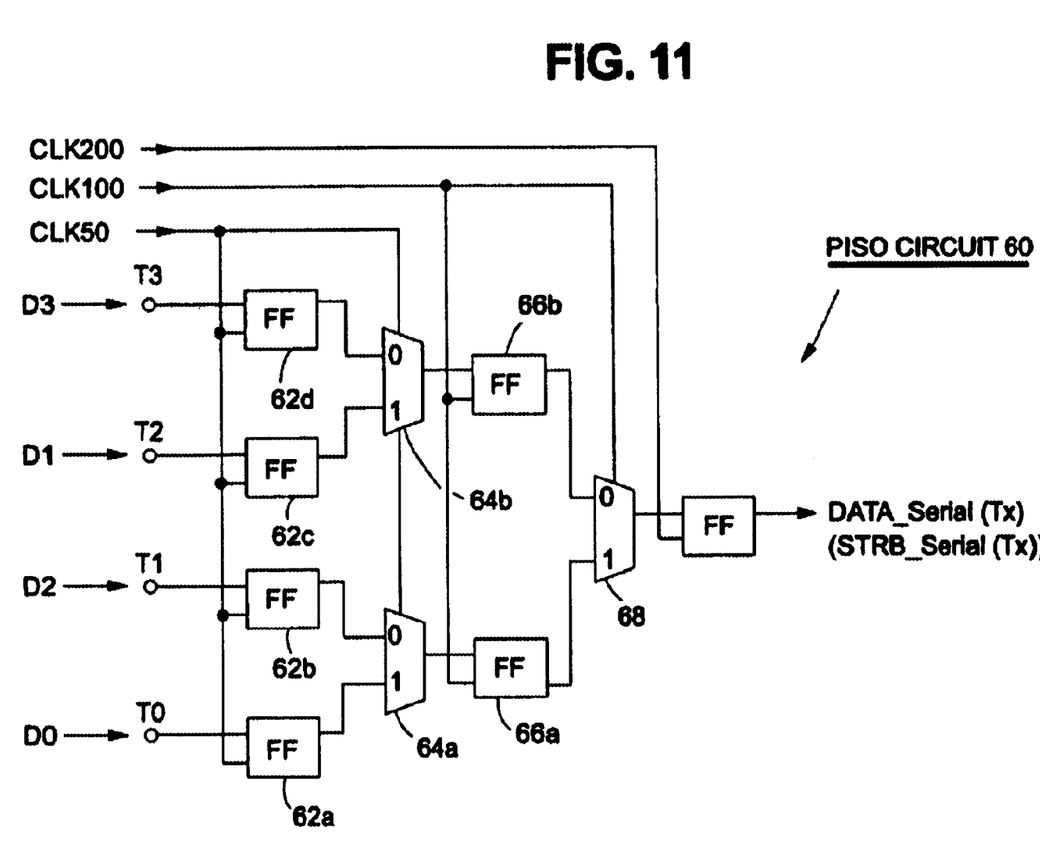
FIG. 11 is a diagram showing a modification of the embodiment of the present invention shown in FIG. 8.

FIG. 11 is a diagram showing a variation of the above-mentioned embodiment of the present invention. As shown, a PISO (parallel in serial out) circuit 60 is to convert a parallel data of four bits (D0–D3) into a 4-bit serial data, and comprises flip-flops 62a–62d, selectors 64a–64b, flip-flops 66a 66b, a selector 68, and a flip-flop 70. Further, the PISO circuit 60 is supplied with three kinds of clocks CLK200, CLK100, and CLK50 in that the inputted parallel data is four. The flip-flops 62a–62d are respectively supplied with inputted parallel data bits D0, D2, D1, and D3, by way of input terminals T0–T3, in order to serially output the data bits in order of DO. D1, D2, and D3. The operation of the PISO 60 can readily be understood from the forgoing, and thus, the further description thereof will be omitted for brevity.

Figure 12:
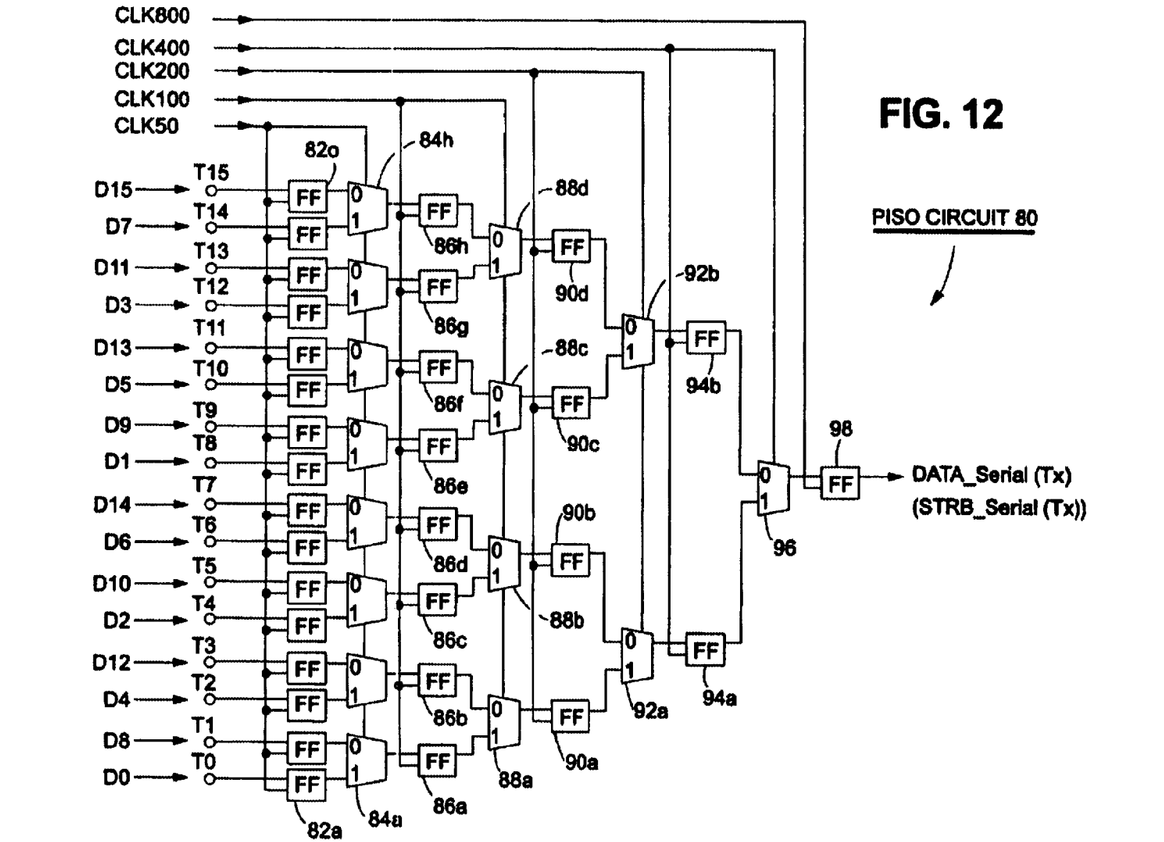
FIG. 12 is diagram showing another modification of the embodiment of the present invention shown in FIG. 8.

FIG. 12 is a diagram showing another variation of the above-mentioned embodiment of the present invention. As shown, a PISO (parallel in serial out) circuit 80 of FIG. 12 is to convert a parallel data of 16 bits (D0–D15) into a 16-bit serial data, and comprises flip-flops 82a–82o, selectors 84a–84h, flip-flops 86a–86h, selector 88a–88d, flip-flops 90a–90d, selectors 92a–92b, flip-flops 94a–94b, a selector 96, and a flip-flop 98. In FIG. 12, some of the reference symbols are omitted merely for the sake of simplifying the drawing. Further, the PISO circuit 80 is supplied with five kinds of clocks CLK800 (800 MHz), CLK 400, CLK200, CLK100, and CLK50 in that the number of inputted parallel data is 16. The flip-flops 82a–82o are respectively supplied with inputted parallel data bits D0, D8, D4 . . . , D11, D7, D15, by way of input terminals T0–T15, in order to serially output the data bits in order of D0–D15. The operation of the PISO 80 can readily be understood from the forgoing, and thus, the further description thereof will be omitted for brevity.

In the above, in order to convert the 4-bit parallel data into the corresponding serial data, the PISO circuit 60 of FIG. 11 Is presented, wherein the flip-flops 46a–46 and the selectors 54a–54d of the PISO circuit 42 of FIG. 8 are omitted and wherein the application of the clock CLK400 is omitted. However, a PISO circuit for converting 4-bit parallel data into the corresponding serial data can be realized without changing the configuration of FIG. 8. In such a case, the first bit data D0 of the 4-bit parallel data is applied to both the input terminals T0 and T4, the second bit data D1 is applied to both the input terminals T2 and T6, the third bit data D2 is applied to both the input terminals T1 and T5, and the last (viz., fourth) bit data D3 is applied to both the input terminals T3 and T7. Therefore, the serial out DATA_Serial (Tx) becomes D1, D1, D2, D2, D3, D3, D4, D4, . . . at the data speed of 400 Mbps. Although the two identical data bits are sequentially-transmitted at the rate of 400 Mbps, the PISO circuit 42 can be used to implement parallel-to-serial conversion of 4-bit data bits without any hardware change thereof. This can be applied to the PISO circuit 80 of FIG. 12, which has been described for implementing parallel-to-serial conversion of 16-bit parallel data. Namely, the PISO circuit 80 can be used to perform the parallel-to-serial conversion of 8 or 4 bit data without any hardware change thereof.

The foregoing descriptions show one preferred embodiment and some modifications thereof. However, other various modifications are apparent to those skilled in the art without departing from the scope of the present invention which is only limited by the appended claims. Therefore, the embodiments and modification shown and described are only illustrated, not restrictive.

What is claimed is:

1. A parallel in serial out circuit for converting $2^r$ data bits (r is a natural number) applied thereto in parallel into a corresponding serial data, comprising:

first to (r+1)-th latch means wherein the s-th ($1 \leq s \leq r+1$) latch means comprises $2^{r+1+s}$ flip-flops; first to r-th selector means respectively provided between adjacent two of said first to (r+1) th latch means; wherein the t-th latch means ($1 \leq t \leq r$) is provided such as to latch $2^{r+1+t}$ data bits in synchronism with a clock signal of $2^{r+2} \times 100$ MHz, and the (r+1)-th latch means is provided to latch a single data bit in synchronism with a clock signal of $2^{r+1-2} \times 100$ MHz, and wherein the u-th selector means ($1 \leq u \leq r$) is provided with $2^{r-u}$ selectors each of which receives two different data bits outputted from the u-th latch means and generates sequentially the received two different data bits in synchronism with a clock signal of $2^{u-2} \times 100$ MHz.

2. The parallel in serial out circuit as claimed in claim 1, wherein the first latch means latches said $2^r$ data bits, and the second to t-th latch means respectively latches $2^{r+1-t}$ data bits outputted from preceding selector means.

3. A parallel in serial out circuit for converting four data bits applied thereto in parallel into a corresponding serial data, comprising: first latch means, which is provided with four flip-flops, for latching respectively said four data bits at said four flip-flops in synchronism with a clock of 50 MHz; the firs selector means comprising two selectors each of which selectively receives two different data bits latched at said first latch means and each of which outputs sequentially the received two different data bits in synchronism with the clock of 50 MHz; second latch means, which is provided with two flip-flops, for latching the two data bits outputted from said two selectors of said first selector means in synchronism with a clock of 100 MHz; second selector means comprising a single selector for selectively receiving the two data bits latched at said second latch means in synchronism with the clock of 100 MHz; and a flip-flop for latching the data bit outputted from said single selector in synchronism with a clock of 200 MHz.

4. A parallel in serial out circuit for converting eight data bits applied thereto in parallel into a corresponding serial data, comprising:

first latch means, which is provided with eight flip-flops, for latching respectively said eight data bits at said eight flip-flops in synchronism with a clock of 50 MHz;

first selector means comprising four selectors each of which selectively receives two different data bits latched at said first latch means and each of which outputs sequentially the received two different data bits in synchronism with the clock of 50MHz;

second latch means, which is provided with four flip-flops, for latching respectively said four data bits outputted from said four selectors of said first selector means at said four flip-flops in synchronism with a clock of 100 MHz;

second selector means comprising two selectors each of which selectively receives two different data bits latched at said second latch means and each of which outputs sequentially the received two different data bits in synchronism with the clock of 100 MHz;

third latch means, which is provided with two flip-flops, for latching respectively the two data bits outputted from said two selectors of said second selector means in synchronism with a clock of 200MHz;

third selector means comprising a single selector for selectively receiving two different data bits latched at said third latch means in synchronism with the clock of 200 MHz; and a flip-flop for latching the data bit outputted from said single selector in synchronism with a clock of 400 MHz.

5. A parallel in serial out circuit for converting sixteen data bits applied thereto in parallel into a corresponding serial data, comprising:

first latch means, which is provided with sixteen flip-flops, for latching respectively said sixteen data bits at said sixteen flip-flops in synchronism with a clock of 50 MHz;

first selector means comprising eight selectors each of which selectively receives two different data bits latched at said first latch means and each of which outputs sequentially the received two different data bits in synchronism with the clock of 50 MHz;

second latch means, which is provided with eight flip-flops, for respectively latching the eight data bits outputted from said eight selectors of said first selector means at said eight flip-flops in synchronism with a clock of 100 MHz;

second selector means comprising four selectors each of which selectively receives two different data bits latched at said second latch means and each of which outputs sequentially the received two different data bits in synchronism with the clock of 100 MHz;

third latch means, which is provided with four flip-flops, for latching respectively the four data bits outputted from said four selectors of said second selector means at said four flip-flops in synchronism with a clock of 200 MHz;

third selector means comprising two selectors each of which selectively receives two different data bits latched at said third latch means and each of which outputs sequentially the received two different data bits in synchronism with the clock of 200 MHz;

fourth latch means, which is provided with two flip-flops, for latching respectively the two data bits outputted from said two selectors of said third selector means in synchronism with a clock of 400 MHz;

fourth selector means comprising a single selector for selectively receiving two different data bits latched at said fourth latch means in synchronism with the clock of 400MHz; and a flip-flop for latching the data bit outputted from said single selector in synchronism with a clock of 800MHz.

6. The parallel in serial out circuit as claimed in claim 5, wherein said second clock signal is frequency divided so as to generate said first clock signal of m-MHz.

7. A parallel in serial out circuit for receiving $2^r$ parallel data bits (r is a natural number) in synchronism with a first clock signal of m-MHz and converting said $2^r$ parallel data bits into a corresponding serial data in synchronism with a second clock signal, comprising:

first to (r+1)-th latch means wherein the s-th ($1 \leq s \leq r+1$) latch means comprises $2^{r+1-t}$ flip-flops;

first to r-th selector means respectively provided between adjacent two of said first to (r+1)-th latch means;

wherein the t-th latch means ($1 \leq t \leq r$) is provided such as to latch $2^{r+1-t}$ data bits in synchronism with a clock signal of $2^{t-1} \times m$-MHZ, and the (r+1)-th latch means is provided to latch a single data bit in synchronism with a clock signal of $2^r \times m$-MHz, and wherein the u-th selector means ($1 \leq u \leq r$) is provided with $2^{r-u}$ selectors each of which receives two different data bits outputted from the u-th latch means and generates sequentially the received two different data bits in synchronism with a clock signal of $2^{u-1} \times m$-MHz.

* * * * *